US005731551A

United States Patent [19]

Petrucci

[11] Patent Number: 5,731,551

[45] Date of Patent: Mar. 24, 1998

[54] MOUNTING ASSEMBLY AND METHOD FOR MOUNTING A LOUDSPEAKER IN A VEHICLE

[75] Inventor: Brian Sydney Petrucci, Farmington Hills, Mich.

[73] Assignee: Ford Motor Company, Dearborn, Mich.

[21] Appl. No.: 43,113

[22] Filed: Apr. 5, 1993

[51] Int. Cl.$^6$ .................. H05K 5/00

[52] U.S. Cl. .................. 181/150; 181/141

[58] Field of Search .................. 181/141, 144, 181/146, 150, 151, 199; 381/86, 88, 188, 189, 205

[56] References Cited

U.S. PATENT DOCUMENTS

| | | | |
|---|---|---|---|
| 1,844,803 | 2/1932 | Seabert | 181/150 |
| 1,864,308 | 6/1932 | Kolster et al. | 181/199 |
| 2,744,584 | 5/1956 | Hellon | 181/150 |
| 3,353,625 | 11/1967 | Scanlon | 181/199 |
| 3,696,885 | 10/1972 | Grieg et al. | 181/199 |
| 4,005,761 | 2/1977 | Okamoto et al. | 181/141 |
| 4,056,165 | 11/1977 | Okamoto et al. | 181/141 |
| 4,136,755 | 1/1979 | Goes | 181/141 |
| 4,161,995 | 7/1979 | Pohlmann et al. | 181/150 |
| 4,179,009 | 12/1979 | Birkner | 181/141 X |
| 4,281,224 | 7/1981 | Castagna | 181/150 |
| 4,514,599 | 4/1985 | Yanagishima et al. | 181/141 |
| 4,546,850 | 10/1985 | Litner | 181/141 |
| 4,572,326 | 2/1986 | Hutchins | 181/150 |
| 4,653,607 | 3/1987 | Bage | 181/141 X |
| 4,720,867 | 1/1988 | Imai et al. | 381/86 |
| 4,853,966 | 8/1989 | Skrzycki | 181/150 X |
| 4,974,698 | 12/1990 | Smith | 181/150 |
| 4,993,510 | 2/1991 | Kato et al. | 181/141 |
| 5,113,968 | 5/1992 | Lemmon | 181/150 X |

*Primary Examiner*—Khanh Dang
*Attorney, Agent, or Firm*—Mark L. Mollon; Roger L. May

[57] ABSTRACT

A mounting assembly (10) and method for mounting a loudspeaker (40) in a vehicle (16) are disclosed. A vehicle body member (20) is provided to which a loudspeaker may be mounted. A support member (22), preferably made from a sound dampening material, is interposed between the body member and the passenger compartment (28). The support member (22) has an opening (54) in alignment with the loudspeaker (40) so that sound is directed through the opening (54). An acoustically transparent grille (24) extends across the opening (54) in the support member (22). A trim cloth (26) is used to cover and hide the support member (22) and the grille (24) from view from within the passenger compartment (28).

17 Claims, 1 Drawing Sheet

MOUNTING ASSEMBLY AND METHOD FOR MOUNTING A LOUDSPEAKER IN A VEHICLE

TECHNICAL FIELD

The present invention relates to mounting assemblies and methods for mounting loudspeakers in vehicles.

BACKGROUND ART

It is preferable to reduce noise which passes from a vehicle body to the passenger compartment of a vehicle. Accordingly, noise and vibration dampening materials and components are interposed between the passenger compartment and the vehicle body to prevent noise from entering the passenger compartment. Loudspeakers of the vehicle's stereo or radio system typically are mounted in compartments between the vehicle body and the passenger compartment. Openings or perforations are formed in the sound dampening components to permit sound from the loudspeakers to reach the passenger compartment.

Loudspeakers often are located to the rear of the passenger compartment between the vehicle trunk and the vehicle rear window. Conventionally, a couple of mounting assembly designs have been used in this area.

In a first design, a pair of loudspeakers are attached to and are supported in openings in a metal package tray which extends across the forward portion of the vehicle trunk. Spaced above the package tray is a package tray trim substrate which is made of a sound dampening material such as a pressed wood fiberboard or sawdust filled polypropylene.

Sounds or vibrations attempting to pass from the trunk into the passenger compartment are absorbed by the trim substrate.

In order to allow sound to pass from the loudspeakers into the vehicle passenger compartment, small perforations are formed in the trim substrate above the loudspeakers. A decorative trim cloth is used to cover the trim substrate and is exposed to the passenger compartment to provide an aesthetically pleasing appearance to the vehicle's interior.

This design, while relatively inexpensive to manufacture, provides for less than ideal transmission of sound from the loudspeakers into the passenger compartment. As sound passes through the perforations in the trim substrate, a portion of the wave energy of the sound is absorbed by the sound absorbing material. As a result, anomalies are introduced into the sound reaching the passenger compartment.

An alternative design is available which provides for a higher quality sound transmission. Again, a pair of loudspeakers are mounted in openings in a package tray located between a vehicle trunk and a back window. Also, a package tray trim substrate, comprised of a sound dampening material, is again located above the package tray. However, in this design, a pair of openings, approximately the size of the cone or slightly larger, are formed in the trim substrate and are aligned above the loudspeakers. Sound waves pass directly through the openings in the sound dampening trim substrate without sound energy being absorbed.

Cup-shaped decorative grilles are placed atop the openings to protect the loudspeakers. Generally, the grilles absorb very little sound energy, and the sound reaching the passenger compartment is virtually unaffected by the overall loudspeaker mounting assembly. Accordingly, these grilles are referred to as being acoustically transparent. Again, a decorative trim cloth is used to cover the trim substrate and has openings through which the grilles project.

However, as the grilles are visible from within the passenger compartment, the grilles must meet strict decorative appearance standards and conform with the overall design scheme of the vehicle interior. Consequently, the grilles must be of high quality and are relatively expensive to manufacture. Further, as the grilles are exposed to the passenger compartment, their surfaces are subject to scratching and marring.

While providing high quality sound transmission, this particular loudspeaker mounting assembly design is significantly more expensive to manufacture than the design using perforations in the sound dampening material forming the trim substrate. This cost is particularly significant when the production of thousands of such assemblies using decorative grilles is considered.

For the foregoing reasons, there is a need for a mounting assembly and a method for mounting loudspeakers in a vehicle which are relatively inexpensive while providing for high quality sound transmission from the loudspeakers to the vehicle passenger compartment. The present invention is intended to overcome shortcomings associated with the above-described loudspeaker mounting assemblies.

SUMMARY

The present invention is directed to a mounting assembly for mounting a loudspeaker in a vehicle with the loudspeaker directing sound into the vehicle passenger compartment. The mounting assembly comprises a vehicle body member and a support member, preferably made from a sound dampening material, which is interposed between the vehicle body member and the passenger compartment. The support member has an opening therein aligned with the loudspeaker so that sound from the loudspeaker is directed through the opening. The mounting assembly further includes an acoustically transparent grille, which extends across the opening in the support member, and a trim cloth covering preferably all, but at least a portion of the support member and the grille. Sound from the loudspeaker passes through the opening in the support member and the grille to reach the vehicle passenger compartment while the trim cloth hides the support member and the grille from view from within the vehicle compartment.

Ideally, the grille and the support member cooperate to form a flush surface which is covered by the trim cloth with the grille providing support to the trim cloth so that the trim cloth cannot sag into the opening in the support member. The opening may have a periphery with a stepped recess, and the grille may have a perimeter which is received in the stepped recess so that the grille and the support member form the flush surface.

The support member, the grille and the trim cloth combine to form a panel assembly which is mounted over a vehicle body member such as the package tray located over the vehicle trunk and beneath the back window.

The present invention also includes a method for mounting a loudspeaker in a vehicle with the loudspeaker directing sound into the vehicle passenger compartment. The method comprises the following steps. An acoustically transparent grille is mounted across an opening in a support member. The grille and at least a portion of the support member are then covered with a trim cloth. The support member is attached to the vehicle body with the trim cloth hiding the support member and the grille from within the passenger compartment. Further, the loudspeaker is mounted in alignment with the grille to direct sound waves thereto. Accordingly, noise and vibration are inhibited from passing from the vehicle body to the vehicle passenger compartment while sound directed from the loudspeaker is allowed to enter the passenger compartment through the opening in the support member and the grille.

Preferably, the step of covering the support member and the grille includes placing the trim cloth in contact with the grille so that the trim cloth cannot sag into the opening in the support member. Also, ideally, a stepped recess is formed in the opening of the support member and a perimeter is formed on the grille that is received within the stepped recess so that the support member and the grille form a flush surface which is covered by the trim cloth.

It is an object of the present invention to provide a mounting assembly for use with a vehicle loudspeaker which is relatively inexpensive to manufacture while providing a high quality of sound transmission from the loudspeaker mounted therein into the vehicle passenger compartment.

It is another object to provide a panel assembly for a loudspeaker mounting assembly which has a support member with an opening therein which receives an acoustically transparent grille so that the support member and grille form a flush surface, the flush surface being covered by a decorative trim cloth to hide the support member and the grille.

It is a further object to provide a stepped recess in the opening in the support member which receives the perimeter of the grille to form the flush surface.

It is another object to provide an acoustically transparent grille which is cheaper to manufacture than conventional decorative grilles.

Yet another object is to provide a method of making a mounting assembly for use with a vehicle loudspeaker which includes the steps of forming an opening in a sound dampening support member, placing a grille across the opening, and covering and hiding the grille and support member beneath a decorative trim cloth with sound passing from a loudspeaker, through the grille, and into the vehicle passenger compartment.

BRIEF DESCRIPTION OF THE DRAWINGS

These and other features, aspects, and advantages of the present invention will become better understood with regard to the following description, appended claims, and accompanying drawings wherein:

DESCRIPTION OF THE INVENTION

For purposes of describing the present invention, the term "acoustically transparent" shall characterize the ability of a component to allow sound waves to pass therethrough with little or no loss of sound energy. Further, there is little degradation in amplitude or clarity of the transmitted sound. To the contrary, the term "sound absorbing" shall refer to the ability of a material to absorb most of the energy from sound waves passing through, or being reflected from, the material. Consequently, the magnitude and/or frequency of the original sound is altered, thereby producing anomalies in the sound.

Figure 1:
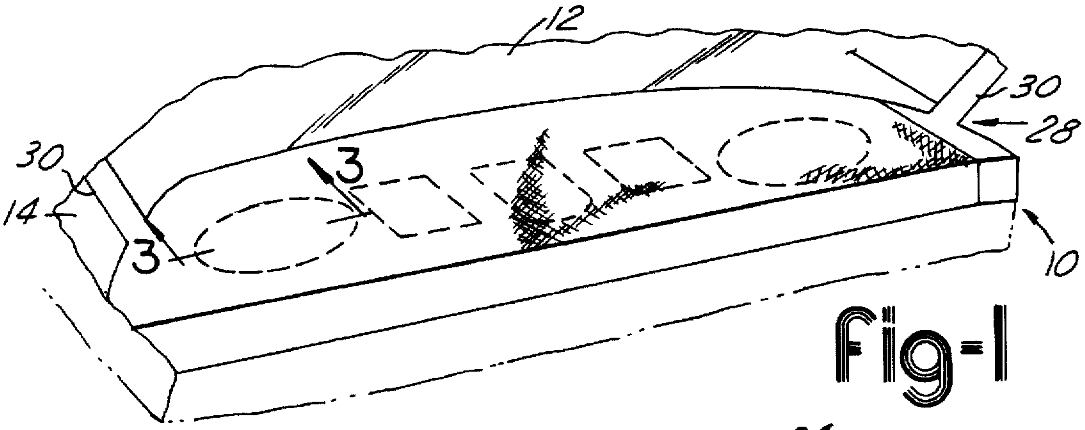
FIG. 1 is a fragmentary perspective view of a mounting assembly, made in accordance with the present invention, which is located beneath the rear window of a vehicle.
Figure 2:
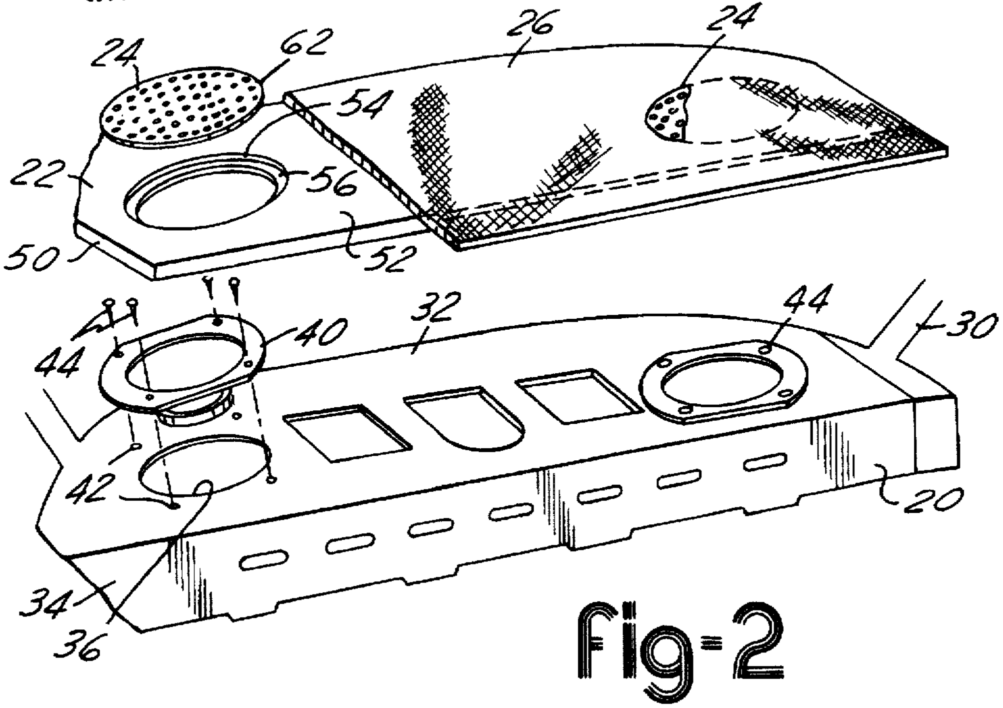
FIG. 2 is an exploded view, partially in cutaway, of the mounting assembly of FIG. 1.

Referring now to FIG. 1, a mounting assembly 10, made in accordance with the present invention, is shown. Mounting assembly 10, in this embodiment, is located between a back window 12 and a trunk 14 of a vehicle 16. FIG. 2 shows an exploded view of mounting assembly 10 including a package tray 20, a package tray trim substrate 22, a pair of acoustically transparent grilles 24 and a trim cloth 26 covering trim substrate 22 and transparent grilles 24. Only trim cloth 26 is visible from within a vehicle passenger compartment 28. The combined trim substrate 22, grilles 24 and trim cloth 26 collectively form a panel assembly 29 which mounts upon package tray 20.

Package tray 20 is a vehicle body member and is made of metal, preferably stamped steel. During construction of a vehicle 16, package tray 20 is welded in an opening covering the forward portion of vehicle trunk 14 between back window posts 30.

Figure 3:
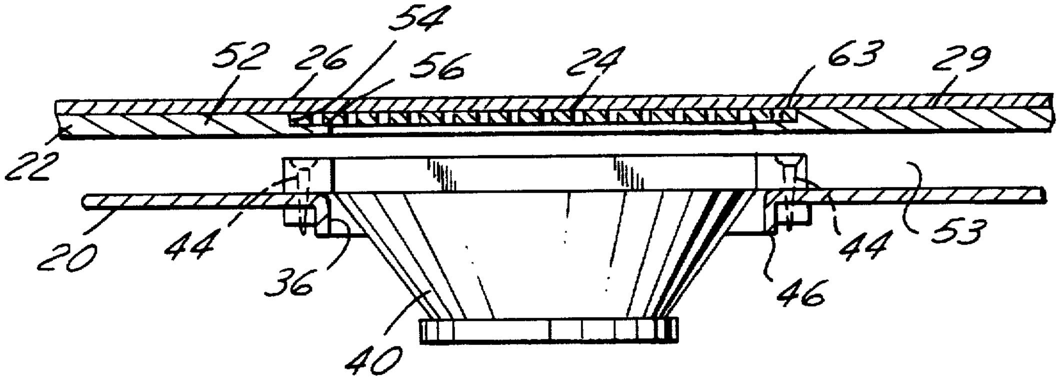
FIG. 3 is a sectional view taken along line 3—3 of FIG. 1.

Package tray 20 has a generally planar horizontal portion 32 spanning between window posts 30 and a vertical portion 34 which provides support for the vehicle back seat. Located in horizontal portion 32 are a pair of oval-shaped and laterally spaced apertures 36 sized to receive a pair of respective loudspeakers 40. Four spaced holes 42, which receive respective screws 44, are used to mount loudspeakers 40 to package tray 20. As seen in FIG. 3, a downwardly depending flange 46 surrounds and provides increased structural stiffness to each aperture 36.

Trim substrate 22 operates as a support member for supporting grilles 24 and trim cloth 26. Also, trim substrate 22 serves as a barrier to inhibit the transfer of sound and vibration attempting to pass from trunk 14 into passenger compartment 28. Accordingly, trim substrate 22 is made of a sound dampening material. Typically, these dampening materials are made from either pressed fiberboard or sawdust filled polypropylene. These materials absorb sound and vibration energy, thereby significantly diminishing their transfer into vehicle passenger compartment 20.

Trim substrate 22 has an outer periphery 50 which rests atop package tray 20. Trim substrate 22 is contoured to space a center portion 52 above package tray 20 creating a compartment 53 therebetween. Located in center portion 52 are a pair of openings 54 sized to receive a pair of grilles 24. Openings 54 have stepped recesses 56 into which grilles 24 fit. To insure sound produced by loudspeakers 40 reaches passenger compartment 28, openings 54 are aligned with apertures 36 so that sound is directed from loudspeakers 40 through openings 54.

Although not shown in the present embodiment, it is possible to place NVH (noise, vibration and harshness) material between trim substrate 22 and package tray 20. The NVH material is a felt-like material and is particularly well suited for sound absorption.

Grilles 24 are preferably of a one-piece, unitary construction and have perimeters 62 which fit snugly within openings 54 in trim substrate 22. Adhesives are used to permanently affix grilles 24 within stepped recesses 56. Alternatively, other methods such as stapling or using mechanical fasteners may be used to affix grilles 24 to trim substrate 22. Perforations 60 are interspersed throughout grille 24 to assist in sound transmission. Stepped recesses 56 are recessed and sized such that grilles 24 and the top surface on center portion 52 of trim substrate 22 form a flush surface 63.

Grilles 24 preferably are made of expanded metal. Alternatively, they may be made from a molded plastic. In either case, these materials absorb very little sound or vibration energy and, therefore, provide for good sound transmission from loudspeakers 40 into vehicle passenger compartment 28. Accordingly, grilles 24 are "acoustically transparent" and do not affect the quality of the sound reaching passenger compartment 28.

Decorative trim cloth 26 overlies trim substrate 22 and grilles 24. As grilles 24 and trim substrate 22 combine to form flush surface 63, there is no depression or protrusion created by grille 24 in the surface of trim cloth 26. Grille 24 also serves to prevent trim cloth 26 from sagging into openings 54 as trim cloth 26 relaxes with time. Trim cloth 26 should match the rest of the decor of the passenger compartment 28 to provide an aesthetically pleasing appearance to the interior of vehicle 16.

Because grille 24 is hidden from view from within the interior of passenger compartment 28, grilles 24 need not meet the strict appearance criteria that ordinary decorative grilles visible from within the passenger compartment must meet. Accordingly, grille need not be painted nor are scratched surface a concern. Therefore, manufacturing rejection rates for grilles 24 are lower than for conventional decorative grilles.

While in this preferred embodiment, grilles 24 and trim substrate 22 are completely hidden from view from within the passenger compartment, it is also possible that only a portion of trim substrate 22 is covered. Accordingly, the uncovered portion of trim substrate 22 may be painted, such as with a textured paint, or otherwise covered by another medium.

The present invention also includes a method for mounting a loudspeaker 40 in a vehicle 16 with the loudspeaker 40 directing sound into the vehicle passenger compartment 28. The method comprises the following steps.

A support member, such as trim substrate 22, is formed with an opening 54, or a pairing of openings 54, therein. One or two respective acoustically transparent grilles 24 are also made. Grilles 24 are then mounted across openings 54 in support member 22. Grilles 24 and support member 22 are then covered with a trim cloth 26 to form a panel assembly 29.

Loudspeakers 40 are mounted to a vehicle body member such as package tray 20. Panel assembly 29 is mounted upon package tray 20 with trim cloth 26 hiding support member 22 and grilles 24 from view from within passenger compartment 28.

Accordingly, noise and vibration are inhibited from passing from the vehicle body through support member 22 to the vehicle passenger compartment 28 while sound directed from loudspeaker 40 is allowed to enter the passenger compartment 28 through openings 54 in support member 22 and grilles 24.

Preferably, the step of covering the support member 22 and grilles 24 includes placing trim cloth 26 in contact with the grille 24 so that the trim cloth 26 cannot sag into openings 54 in support member 22. Also, ideally, the steps of forming support member 22 and grilles 24 include forming stepped recesses 56 in openings 54 of support member 22 and forming perimeters 62 on grilles 26 which mount within stepped recesses 56 so that the support member 22 and grilles 24 form a flush surface 63 which is covered by trim cloth 26.

Further, preferably vehicle body member 20 includes apertures 36 for receiving loudspeakers 40 with apertures 36 being in alignment with openings 54 in support member 22 so that sound waves from loudspeakers 40 are directed toward openings 54. Ideally, support member 22, body member 20, and loudspeakers 40 cooperate to form a closed compartment 53.

While this invention has been described in the foregoing specification in relation to certain preferred embodiments thereof, and many details have been set forth for the purposes of illustration, it will be apparent to those skilled in the art that the invention is susceptible to additional embodiments and that certain details described herein can be varied considerably without departing from the basic principles of the invention.

For example, the body member to which a loudspeaker is mounted may be a door panel rather the above-described package tray. Or else, the loudspeaker may be mounted in the front dash or ceiling of the vehicle. Also, the opening in the sound dampened support member may be of any shape. Further, it is possible to mount the loudspeakers to the support members rather than to vehicle body members.

I claim:

1. In combination with a vehicle body defining in part passenger compartment and supporting a loudspeaker, a grille assembly for directing sound from the loudspeaker into the passenger compartment, the grille assembly comprising:

a support member on the vehicle body overlying the loudspeaker and having an opening therein aligned with the loudspeaker so that sound from the loudspeaker is directed through the opening;

a discrete acoustically transparent grille extending across the opening in the support member; and a trim cloth covering the grille to conceal its finish and at least a portion of the support member so that the grille cannot be seen from within the passenger compartment;

wherein sound from the loudspeaker passes through the opening in the support member and the grille as it is directed to the passenger compartment.

2. The combination of claim 1 wherein:

the grille and the support member are completely hidden from view from within the passenger compartment by the trim cloth.

3. The combination of claim 1 wherein:

the support member is made from a sound dampening material so that noise from outside the passenger compartment is inhibited from passing through the support member to enter the passenger compartment.

4. The combination of claim 3 wherein:

the sound dampening material is a pressed fiberboard or a filled polypropylene.

5. The combination of claim 1 wherein:

the grille is made of metal or plastic.

6. The combination of claim 1 wherein:

the grille and the support member cooperate to form a flush surface which is covered by the trim cloth, the grille providing support to the trim cloth so that the trim cloth cannot sag into the opening in the support member.

7. The combination of claim 6 wherein:

the opening in the support member has a periphery with a stepped recess and the grille has a perimeter which is received in the stepped recess so that the grille and the support member form the flush surface.

8. A grille assembly mountable between a vehicle body and a vehicle passenger compartment of the vehicle body and through which sound from a loudspeaker may pass to reach the vehicle passenger compartment, the panel assembly comprising:

a support member affixable to the vehicle body and having an opening therein for receiving sound directed from a loudspeaker;

a discrete acoustically transparent grille extending across the opening; and a trim cloth covering the grille to conceal its finish and at least a portion of the support member to hide the grille from view from within the vehicle passenger compartment;

wherein sound from the loudspeaker may pass through the opening and the grille to reach the vehicle passenger compartment while the support member inhibits sound from passing therethrough from the vehicle body into the vehicle passenger compartment.

9. The grille assembly of claim 8 wherein:

the grille and the support member are completely hidden from view from within the passenger compartment by the trim cloth.

10. The grille assembly of claim 8 wherein:

the support member is made from a sound dampening material.

11. The grille assembly of claim 10 wherein:

the sound dampening material is a pressed fiberboard or a filled polypropylene.

12. The grille assembly of claim 8 wherein:

the grille and the support member cooperate to form a flush surface which is covered by the trim cloth with the grille providing support so that the trim cloth cannot sag into the opening in the support member.

13. The grille assembly of claim 12 wherein:

the opening in the support member has a periphery with a stepped recess and the grille has a perimeter which is received in the stepped recess so that the grille and the support member form the flush surface.

14. The grille assembly of claim 8 wherein:

the grille is made from metal or plastic.

15. A method for mounting a loudspeaker in a vehicle body defining in part a passenger compartment with the loudspeaker directing sound into the vehicle passenger compartment, the method comprising the steps of:

providing a discrete acoustically transparent grille, a support member having an opening therethrough, a trim cloth and a loudspeaker;

mounting the acoustically transparent grille across the opening in the support member;

covering the grille and at least a portion of the support member with the trim cloth;

mounting the support member to the vehicle body with the trim cloth hiding the grille from within the passenger compartment; and mounting the loudspeaker to the vehicle body in alignment with the grille to direct sound there through;

wherein noise and vibration are inhibited from passing from the vehicle body through the support member and into the vehicle passenger compartment while sound directed from the loudspeaker is allowed to enter the passenger compartment through the opening in the support member and the grille.

16. The method of claim 15 wherein:

the step of covering at least a portion of the support member and the grille includes supporting the trim cloth upon the grille so that the trim cloth cannot sag into the opening in the support member.

17. The method of claim 15 wherein:

the support member is formed with a stepped recess in the opening of the support member and wherein the grille is formed with a perimeter that is received within the stepped recess of the support member so that the support member and the grille form a flush surface which is covered by the trim cloth.

* * * * *